US008847355B2

(12) United States Patent
Chung

(10) Patent No.: US 8,847,355 B2
(45) Date of Patent: Sep. 30, 2014

(54) CAPACITOR STRUCTURES FOR INCLUDING HIGH CAPACITANCE PER UNIT AREA

(71) Applicant: Samsung Electronics Co., Ltd., Suwon-si (KR)

(72) Inventor: Chul-Ho Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/803,251

(22) Filed: Mar. 14, 2013

(65) Prior Publication Data

US 2014/0225225 A1 Aug. 14, 2014

(30) Foreign Application Priority Data

Feb. 8, 2013 (KR) .................. 10-2013-0014628

(51) Int. Cl.
| H01L 29/92 | (2006.01) |
| H01L 49/02 | (2006.01) |
| H01L 27/108 | (2006.01) |

(52) U.S. Cl.
CPC ............. *H01L 28/40* (2013.01); *H01L 27/108* (2013.01)
USPC ....................................... 257/532

(58) Field of Classification Search
CPC .............................. H01L 27/07; H01L 27/108
USPC ......................... 257/296, 532, 533
See application file for complete search history.

(56) References Cited

U.S. PATENT DOCUMENTS

| 7,009,832 | B1 * | 3/2006 | Chen et al. ................. 361/306.1 |
| 7,209,340 | B2 * | 4/2007 | Iioka et al. ................. 361/306.3 |
| 7,816,197 | B2 | 10/2010 | Kim et al. |
| 2005/0139885 | A1 * | 6/2005 | Liu .............................. 257/296 |
| 2006/0024905 | A1 | 2/2006 | He et al. |
| 2007/0267673 | A1 | 11/2007 | Kim et al. |
| 2008/0230820 | A1 | 9/2008 | Maeda et al. |
| 2009/0152612 | A1 | 6/2009 | Kim et al. |
| 2009/0200638 | A1 * | 8/2009 | Smith ........................... 257/532 |
| 2010/0078695 | A1 * | 4/2010 | Law et al. ..................... 257/296 |
| 2010/0087042 | A1 | 4/2010 | Kim et al. |
| 2010/0140740 | A1 | 6/2010 | Matsui |
| 2010/0238603 | A1 * | 9/2010 | Chung ........................ 361/301.4 |
| 2011/0254067 | A1 * | 10/2011 | Abbott et al. ................. 257/296 |
| 2011/0260231 | A1 | 10/2011 | Liang et al. |
| 2011/0309420 | A1 * | 12/2011 | Chang et al. .................. 257/312 |
| 2012/0061739 | A1 | 3/2012 | Kim et al. |
| 2012/0161217 | A1 * | 6/2012 | Sato .............................. 257/296 |
| 2012/0223375 | A1 * | 9/2012 | Maeda et al. ................. 257/296 |

FOREIGN PATENT DOCUMENTS

| JP | 2006049486 | 2/2006 |
| KR | 1020090129074 | 12/2009 |

* cited by examiner

*Primary Examiner* — Nathan Ha
(74) *Attorney, Agent, or Firm* — Onello & Mello, LLP

(57) ABSTRACT

A capacitor structure comprises a substrate extending in a horizontal direction of extension. A first gate insulating film is on the substrate and a first gate pattern is on the first gate insulating film. A first finger-shaped electrode is on the first gate pattern, and a second finger-shaped electrode is on the first gate pattern and alternately disposed with the first electrode to be spaced apart from the first electrode in the horizontal direction. The first electrode is connected to the first gate pattern, and the second electrode and the first gate pattern are insulated from each other.

20 Claims, 14 Drawing Sheets

CAPACITOR STRUCTURES FOR INCLUDING HIGH CAPACITANCE PER UNIT AREA

CROSS-REFERENCE TO RELATED APPLICATIONS

This application is based on and claims priority to Korean Patent Application No. 10-2013-0014628, filed on Feb. 8, 2013 in the Korean Intellectual Property Office, the disclosure of which is incorporated herein in its entirety by reference.

BACKGROUND

1. Field

Embodiments of the present inventive concepts relate to capacitor structures.

2. Background

Capacitors store charge and supply charge required for operation of semiconductor devices. Contemporary semiconductor capacitor configurations include MIM capacitors, VNCAP capacitors, MOS capacitors, varactors, and the like. As semiconductor devices become ever-increasingly integrated, the unit cell continues to become reduced in size, while the overall capacitance required for proper operation of semiconductor device continues to increase. At the same time, since the dielectric material of the dielectric film used for semiconductor capacitors has certain limitations and since the cross sectional area of a unit cell is decreased with increased integration of semiconductor devices, it becomes more and more difficult to increase the capacitance per unit area of a capacitor.

SUMMARY

Aspects of the present inventive concepts provide a capacitor structure that can increase the capacitance per unit area.

Aspects of the present inventive concepts also provide a capacitor structure that is parameterized to increase model accuracy of the resulting capacitor structure.

Additional advantages, objects, and features of the inventive concepts will be set forth in part in the description which follows and in part will become apparent to those having ordinary skill in the art upon examination of the following or may be learned from practice of the inventive concepts.

In one aspect of the present inventive concepts, a capacitor structure comprises a substrate extending in a horizontal direction of extension. A first gate insulating film is on the substrate and a first gate pattern is on the first gate insulating film. A first finger-shaped electrode is on the first gate pattern, and a second finger-shaped electrode is on the first gate pattern and alternately disposed with the first electrode to be spaced apart from the first electrode in the horizontal direction. The first electrode is connected to the first gate pattern, and the second electrode and the first gate pattern are insulated from each other.

In some embodiments, the first electrode and the second electrode further comprise two or more laminated wiring layers and vias connecting the wiring layers.

In some embodiments, the capacitor structure further comprises a first impurity region of a first conduction type that is at sides of the first gate pattern in the substrate, wherein the second electrode is connected to the first impurity region.

In some embodiments, the capacitor structure further comprises first conduction type well in the substrate and a first impurity region of a first conduction type at sides of the first gate pattern in the well, wherein the second electrode is connected to the first impurity region.

In some embodiments, the first gate insulating film comprises at least one SiON, tantalum oxide, titanium oxide, hafnium oxide, lanthanum oxide, and aluminum oxide.

In some embodiments, the capacitor structure further comprises a second gate insulating film on the substrate and a second gate pattern between the second gate insulating film and the first gate insulating film.

In some embodiments, the second electrode is connected to the second gate pattern.

In some embodiments, the first gate insulating film comprises an ONO (Oxide-Nitride-Oxide) insulating film, and the second gate insulating film comprises at least one of SiON, tantalum oxide, titanium oxide, hafnium oxide, lanthanum oxide, and aluminum oxide.

In some embodiments, a first voltage is applied to the first electrode, and a second voltage is applied to the second electrode.

In another aspect, a capacitor structure comprises: a substrate extending in a horizontal direction of extension; a first gate insulating film on the substrate; a first gate pattern on the first gate insulating film; an interlayer insulating layer covering the substrate, the first gate insulating film, and the first gate pattern; a first finger-shaped electrode on the interlayer insulating layer; a second finger-shaped electrode on the interlayer insulating layer and alternately disposed with the first electrode to be spaced apart from the first electrode in the horizontal direction; and first contacts through the interlayer insulating film and connecting the first electrode and the first gate pattern to each other.

In some embodiments, the first electrode and the second electrode further comprise two or more laminated wiring layers and vias connecting the wiring layers.

In some embodiments, the capacitor structure further comprises a first impurity region of a first conduction type that is at sides of the first gate pattern in the substrate, wherein the second electrode is connected to the first impurity region.

In some embodiments, the capacitor structure further comprises a first conduction type well in the substrate and a first impurity region of a first conduction type at sides of the first gate pattern in the well, wherein the second electrode is connected to the first impurity region.

In some embodiments, the capacitor structure further comprises a second gate insulating film on the substrate and a second gate pattern between the second gate insulating film and the first gate insulating film, wherein the interlayer insulating layer covers the substrate, the first gate insulating film, the first gate pattern, the second gate insulating film, and the second gate pattern.

In some embodiments, the capacitor structure further comprises second contacts through the interlayer insulating film and connecting the second electrode and the second gate pattern to each other.

In another aspect of the present inventive concepts, a capacitor structure comprises: a first capacitor comprising a first electrode, a dielectric, and a second electrode, the second electrode on the dielectric and the dielectric on the first electrode; and a second capacitor on the first capacitor, the second capacitor comprising a vertical natural capacitor.

In some embodiments, the first electrode of the first capacitor comprises a substrate, and the second capacitor comprises a first electrode comprising a plurality of first fingers and a second electrode comprising a plurality of second fingers, the first fingers and second fingers separated from each other in a horizontal direction of extension of the substrate and the first fingers and second fingers meshing with each other, the first and second fingers positioned at a patterned conductive layer that is on the first capacitor, an insulating layer between at least portions of the first and second fingers and the second electrode of the first capacitor.

In some embodiments, the capacitor structure further comprises first vias connecting one of the first fingers and second fingers to the second electrode of the first capacitor and wherein a third capacitor is present between the other of the first fingers and second fingers and the second electrode of the first capacitor.

In some embodiments, the capacitor structure further comprises a fourth capacitor on the first capacitor, wherein the fourth capacitor comprises: a first electrode of the fourth capacitor that is the second electrode of the first capacitor; and a dielectric of the fourth capacitor on the first electrode of the fourth capacitor, and a second electrode of the fourth capacitor on the dielectric of the fourth capacitor.

In some embodiments, the vertical natural capacitor comprises a plurality of patterned conductive layers, the conductive layers separated from neighboring conductive layers by insulating layers, each conductive layer comprising a first electrode comprising a plurality of first fingers and a second electrode comprising a plurality of second fingers, the first fingers and second fingers separated from each other in a horizontal direction of extension of the substrate and the first fingers and second fingers meshing with each other, the first fingers of different ones of the conductive layers connected to each other by conductive vias and the second fingers of different ones of the conductive layers connected to each other by conductive vias.

Other details of the present inventive concepts are included in the detailed description and drawings.

BRIEF DESCRIPTION OF THE DRAWINGS

The above and other objects, features and advantages of the present inventive concepts will be more apparent from the following detailed description taken in conjunction with the accompanying drawings, in which.

DETAILED DESCRIPTION OF EMBODIMENTS

Figure 1:
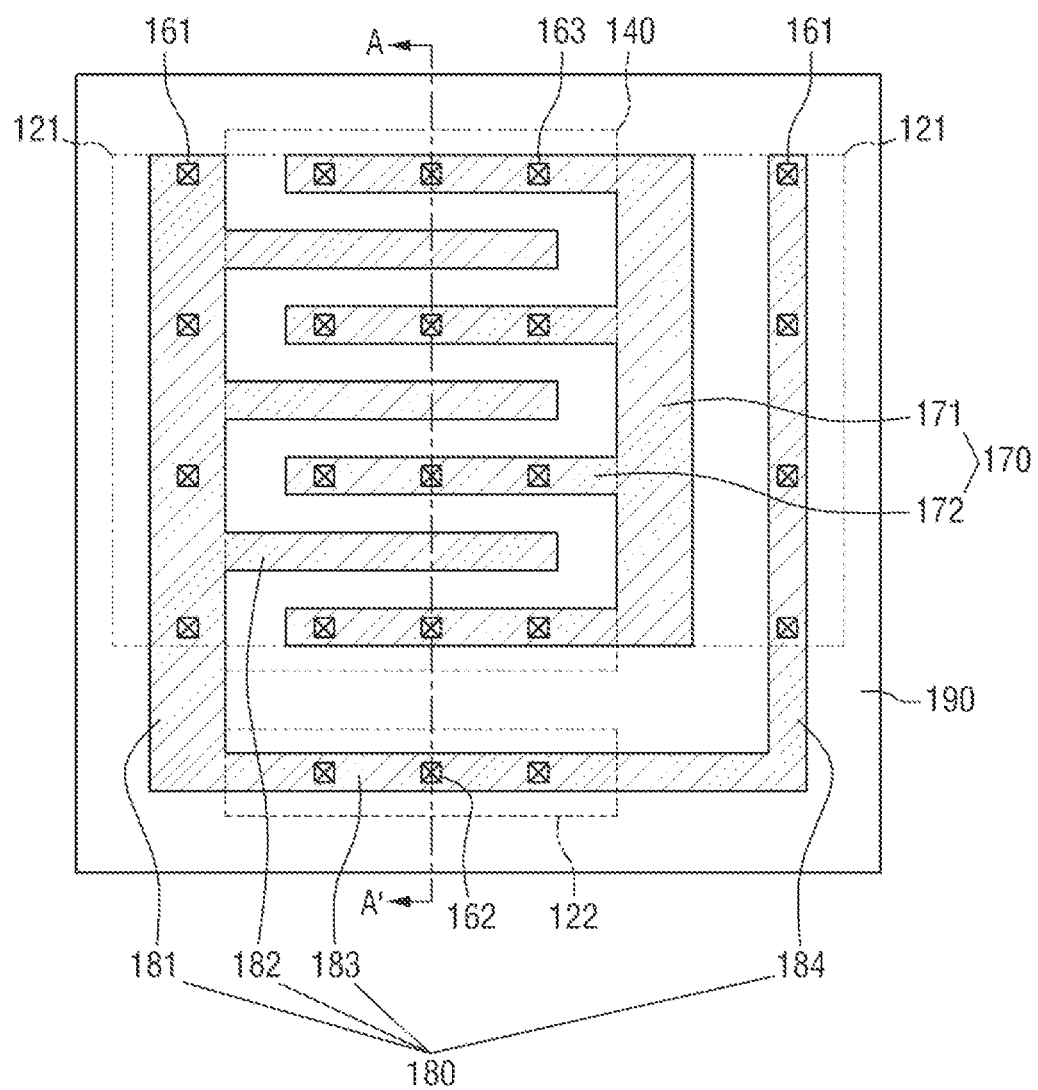
FIG. 1 is a schematic plan view explaining a capacitor structure according to a first embodiment of the present inventive concepts.

The present inventive concepts will now be described more fully hereinafter with reference to the accompanying drawings, in which embodiments of the inventive concepts are shown. This inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concepts belongs. It is noted that the use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be overly interpreted.

The present inventive concepts will be described with reference to perspective views, cross-sectional views, and/or plan views, in which preferred embodiments of the inventive concepts are shown. Thus, the profile of an exemplary view may be modified according to manufacturing techniques and/or allowances. That is, the embodiments are not intended to limit the scope of the present inventive concepts but cover all changes and modifications that can be caused due to a change in manufacturing process. Thus, regions shown in the drawings are illustrated in schematic form and the shapes of the regions are presented simply by way of illustration and not as a limitation.

Hereinafter, preferred embodiments of the present inventive concepts will be described in detail with reference to the accompanying drawings.

Figure 2:
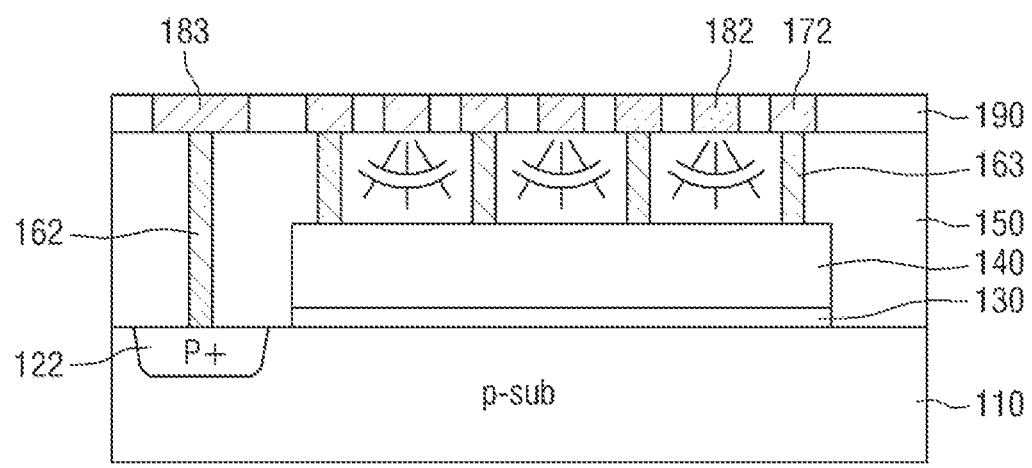
FIG. 2 is a schematic cross-sectional view cut along line A-A' in FIG. 1.

FIG. 1 is a schematic plan view explaining a capacitor structure according to a first embodiment of the present inventive concepts, and FIG. 2 is a schematic cross-sectional view cut along line A-A' in FIG. 1.

Referring to FIGS. 1 and 2, a capacitor structure 1 according to a first embodiment of the present inventive concepts includes a substrate 110, a gate insulating film 130, a gate pattern 140, a first impurity region 121, a second impurity region 122, a first interlayer insulating layer 150, first contacts 161, second contacts 162, third contacts 163, a second interlayer insulating layer 190, a first electrode 170, and a second electrode 180.

The substrate 110 may comprise a substrate including one or more semiconductor materials selected from the group including Si, Ge, SiGe, GaP, GaAs, SiC, SiGeC, InAs, and InP, an SOI substrate, a quartz substrate, and a glass substrate for display. In other embodiments, the substrate 110 may comprise a flexible substrate including polyimide, PET (PolyEthylene Terephthalate), PEN (PolyEthylene Naphthalate), PMMA (Poly Methyl MethAcrylate), PC (PolyCarbonate), PES (Polyethersulfone), polyester, or plastic material. Is some embodiments, semiconductor elements other than the capacitor structure may be disposed on the substrate 110. Exemplarily, the other semiconductor elements may include transistors, resistors, or capacitors, but are not limited thereto. The substrate may be rigid or flexible, depending on the application.

The gate insulating film 130 is formed on the substrate 110. The gate insulating film 130 may be formed to extend in a first direction, for example, in a direction from the top of the page to the bottom of the page in the example embodiment of FIG. 1. The gate insulating film 130 may comprise, for example, silicon oxide, silicon nitride, or other suitable insulating materials. Exemplarily, the gate insulating film 130 may include SiON, but is not limited thereto. In other embodiments, the gate insulating film 130 may include one or more of hafnium oxide, hafnium silicon oxide, lanthanum oxide, lanthanum aluminum oxide, zirconium oxide, zirconium silicon oxide, tantalum oxide, titanium oxide, aluminum oxide, lead scandium tantalum oxide, and lead zinc niobate, but is not limited thereto. The gate insulating film 130 may be a film that is obtained by laminating a plurality of films in order. In some embodiments, other material films may be interposed between the substrate 110 and the gate insulating film 130.

The gate pattern 140 is formed on the gate insulating film 130. In various embodiments, the gate pattern 140 may be formed as a single layer or a multi-layer that includes titanium (Ti), tantalum (Ta), aluminum (Al), tungsten (W), or an alloy thereof, or other conductive material, but is not limited thereto.

The first impurity region 121 is formed on both sides of the gate pattern 140 in the substrate 110. The first impurity region 121 may correspond to a source/drain region. The width of the first impurity region 121 at one side of the gate pattern 140 may be greater than the width of the first impurity region 121 formed at the other side of the gate pattern 140. Exemplarily, the first impurity region 121 may be of a first conduction type. The first conduction type may be an n-type or a p-type. Hereinafter, explanation will be made on the assumption that the first conduction type is the n-type.

The second impurity region 122 is formed adjacent to the gate pattern 140 in the substrate 110. The second impurity region 122 may correspond to a bulk region. Exemplarily, the second impurity region 122 may be of a second conduction type. The second conduction type is opposite to the first conduction type. Hereinafter, explanation will be made on the assumption that the second conduction type is the p-type.

The first interlayer insulating layer 150 is formed to cover the substrate 110, the gate insulating film 130, and the gate pattern 140. Exemplarily, the first interlayer insulating layer 150 may include silicon oxide, but is not limited thereto. The second interlayer insulating layer 190 is formed on the first interlayer insulating layer 150. The second interlayer insulating layer 190 may include the same material as the first interlayer insulating layer 150 or a material that is different from the material of the first interlayer insulating layer 150.

The first electrode 170 is formed on the first interlayer insulating layer 150. The first electrode 170 may be in a finger shape. The first electrode 170 may include a first bar-shaped wiring 171 and a plurality of second finger-shaped wirings 172 connected to the first wiring 171. The first wiring 171 of the first electrode 170 may be formed to extend in the first direction, and the second wirings 172 of the first electrode 170 may be formed to extend in a second direction, for example, in a direction from the left side of the page to the right side of the page in the example embodiment of FIG. 1. The first wiring 171 of the first electrode 170 may be disposed on the first impurity region 121 formed on one side of the gate pattern 140, and the second wirings 172 of the first electrode 170 may be disposed on the gate pattern 140. In some embodiments, the second wirings 172 of the first electrode 170 may be disposed to be spaced apart from each other and to be parallel to each other.

The second electrode 180 is formed on the first interlayer insulating layer 150. The second electrode 180 may include portions that are in the shape of a plurality of fingers that mesh with the fingers of the first electrode 170. The second electrode 180 may include a first bar-shaped wiring 181 and a plurality of second finger-shaped wirings 182 connected to the first wiring 181. The first wiring 181 of the second electrode 180 may be formed to extend in the first direction, and the second wirings 182 of the second electrode 180 may be formed to extend in the second direction. The first wiring 181 of the second electrode 180 may be disposed on the first impurity region 121 formed on the other side of the gate pattern 140, and the second wirings 182 of the second electrode 180 may be disposed on the gate pattern 140. The second wirings 182 of the second electrode 180 may be disposed to be spaced apart from each other and to be parallel to each other. Further, the second electrode 180 may further include a third wiring 183 formed to extend in the second direction from one end of, or from a portion of, the first wiring 181 and may include a fourth wiring 184 formed to extend in the first direction from one end of, or a portion of the third wiring 183. At least a part of the third wiring 183 may be disposed on the second impurity region 122, and at least a part of the fourth wiring 184 may be disposed on the first impurity region 121 at the other side of the gate pattern 140, that is, at the side of the gate pattern 140 opposite the first wiring 181.

The second wirings 172 of the first electrode 170 and the second wirings 182 of the second electrode 180 are alternately disposed to be spaced apart from each other in a meshed configuration. FIG. 1 illustrates that the second wirings 182 of the second electrode 180 are disposed between the second wirings 172 of the first electrode 170; however, embodiments of the present inventive concepts are not limited to this specific configuration. The second wirings 172 of the first electrode 170 may be disposed between the second wirings 182 of the second electrode 180. The first electrode 170 and the second electrode 180 may be insulated from each other by the second interlayer insulating layer 190. Exemplarily, the first electrode 170 and the second electrode 180 may include metal or metal nitride; however, embodiments of the present inventive concepts are not limited thereto. In some example embodiments, the metal may comprise copper, tungsten, aluminum, ruthenium, platinum, titanium, tantalum, alloys thereof and other metals, and the metal nitride may comprise tungsten nitride, tantalum nitride, or titanium nitride.

The first contacts 161, the second contacts 162, and the third contacts 163 are formed to penetrate the first interlayer insulating layer 150. The first contacts 161 connect the second electrode 180 and the first impurity region 121 to each other. Specifically, one part of the first contacts 161 may connect the first wiring 181 of the second electrode 180 to the first impurity region 121 formed on one side of the gate pattern 140, and the other part of the first contacts 161 may connect the fourth wiring 184 of the second electrode 180 to the first impurity region 121 formed on the other side of the gate pattern 140. The second contacts 162 connect the second electrode 180 and the second impurity region 122 to each other. Specifically, the second contacts 162 may connect the third wiring 183 of the second electrode 180 to the second impurity region 122. The third contacts 163 connect the first electrode 170 and the gate pattern 140 to each other. Specifically, the third contacts 163 may connect the second wirings 172 of the first electrode 170 to the gate pattern 140. The third contacts 163 may be disposed along the second direction that is a direction of extension of the second wirings 172 of the first electrode 170. On the other hand, on lower portions of the second wirings 182 of the second electrode 180, the third contacts 163 are not formed, but the first interlayer insulating layer 150 is present, and thus the second electrode 180 and the gate pattern 140 are not connected to each other. Exemplarily, in various embodiments, the first contacts 161, the second contacts 162, and the third contacts 163 may include metal or metal nitride, but are not limited thereto.

In other embodiments, a first conduction type well may be formed in the substrate 110. Further, in other embodiments, the first impurity region 121 of the first conduction type may be formed on both sides of the gate pattern 140 in the well.

A first voltage may be applied to the first electrode 170, and a second voltage may be applied to the second electrode 180. According to the capacitor structure according to the first embodiment of the present inventive concepts, the substrate 110, the gate insulating film 130, and the gate pattern 140 form a first capacitor. Exemplarily, the first capacitor may be a MOS capacitor or a varactor. Further, the second wirings 172 of the first electrode 170, the second interlayer insulating layer 190, and the second wirings 182 of the second electrode 180 form second capacitors. The second capacitor may be a vertical natural capacitor (VNCAP). Further, the second wirings 182 of the second electrode 180, the first interlayer insulating layer 150, and the gate pattern 140 form third capacitors. Thus, according to the capacitor structure according to the first embodiment of the present inventive concepts, a plurality of capacitors per unit area can be formed, and thus capacitance per unit area can be increased. Further, in the case of connecting a MOS transistor or a varactor to a VNCAP in parallel, a parameterized cell is provided by a standardized layout, and thus the model accuracy of the capacitor can be increased.

Figure 3:
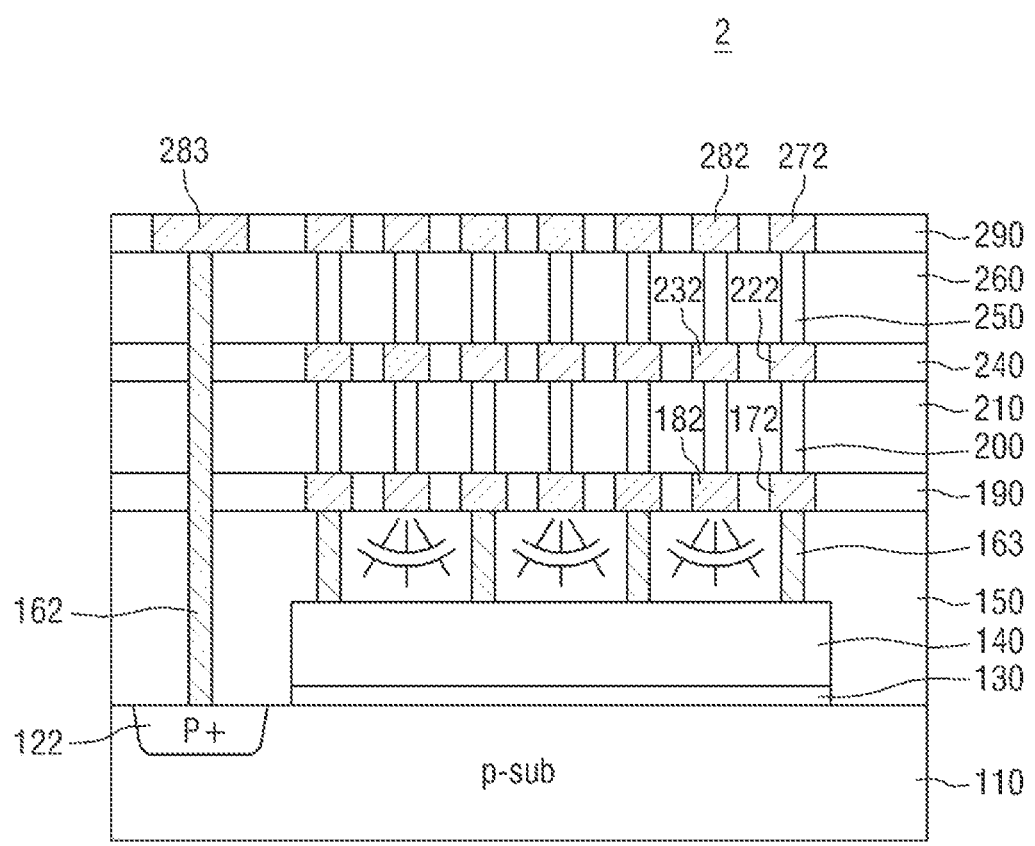
FIG. 3 is a schematic cross-sectional view cut along the same line as line A-A' in FIG. 1, explaining a capacitor structure according to a second embodiment of the present inventive concepts.

FIG. 3 is a schematic cross-sectional view cut along the same line as the line A-A' in FIG. 1, explaining a capacitor structure according to a second embodiment of the present inventive concepts. For convenience in explanation, the explanation will be made about a different point from that of FIG. 2.

Referring to FIG. 3, a capacitor structure 2 according to a second embodiment of the present inventive concepts includes a substrate 110, a gate insulating film 130, a gate pattern 140, a first impurity region 121, a second impurity region 122, a first interlayer insulating layer 150, first contacts 161, second contacts 162, third contacts 163, a second interlayer insulating layer 190, a first electrode, and a second electrode.

The substrate 110, the gate insulating film 130, the gate pattern 140, the first impurity region 121, the second impurity region 122, the first interlayer insulating layer 150, the first contacts 161, the second contacts 162, the third contacts 163, and the second interlayer insulating layer 190 are formed substantially in the same manner as described above with reference to FIGS. 1 and 2.

Each of the first electrode and the second electrode includes two or more laminated wiring layers and vias connecting the wiring layers.

Exemplarily, the first electrode may include a first wiring layer, a third wiring layer, and a fifth wiring layer, and the second electrode may include a second wiring layer, a fourth wiring layer, and a sixth wiring layer. The first wiring layer and the second wiring layer may be formed on the first interlayer insulating layer 150, the third wiring layer and the fourth wiring layer may be formed on a third interlayer insulating layer 210, and the fifth wiring layer and the sixth wiring layer may be formed on a fifth interlayer insulating layer 260. First vias 200 are formed to penetrate the third interlayer insulating layer 210, and second vias 250 are formed to penetrate the fifth interlayer insulating layer 260. The first wiring layer and the third wiring layer, and the second wiring layer and the fourth wiring layer are respectively connected through the first vias 200. The third wiring layer and the fifth wiring layer, and the fourth wiring layer and the sixth wiring layer are respectively connected through the second vias 250. The first vias 200 and the second vias 250 may include metal or metal nitride, but are not limited thereto. The metal may comprise copper, tungsten, aluminum, ruthenium, platinum, titanium, or tantalum, or alloys thereof, or other suitable metals or conductive materials, and the metal nitride may be tungsten nitride, tantalum nitride, or titanium nitride.

The respective wiring layers, substantially in the same manner as described above, may include a first bar-shaped wiring and a plurality of second finger-shaped wirings 172, 182, 222, 232, 272, and 282 connected to the first wiring.

On the second interlayer insulating layer 190, the third interlayer insulating layer 210, a fourth interlayer insulating layer 240, the fifth interlayer insulating layer 260, and a sixth interlayer insulating layer 290 are laminated in order. The interlayer insulating layers 190, 210, 240, 260, and 290 may include the same material as the first interlayer insulating layer 150 or a material that is different from the material of the first interlayer insulating layer 150. The first electrode and the second electrode may be insulated by the second interlayer insulating layer 190, the fourth interlayer insulating layer 240, and the sixth interlayer insulating layer 290.

The embodiment of FIG. 3 illustrates that the third wiring 283 of the second electrode is formed to extend from the first wiring of the sixth wiring layer; however, embodiments are not limited thereto. In other example embodiments, the third wiring 283 of the second electrode may be formed to extend from the first wiring of any wiring layer among the two or more laminated wiring layers of the second electrode.

According to the capacitor structure according to the second embodiment of the present inventive concepts, since the number of capacitors per unit area of the first electrode and the second electrode is increased, the capacitance of the VNCAP is increased, and thus the capacitance of the capacitor structure 2 can be increased.

Figure 4:
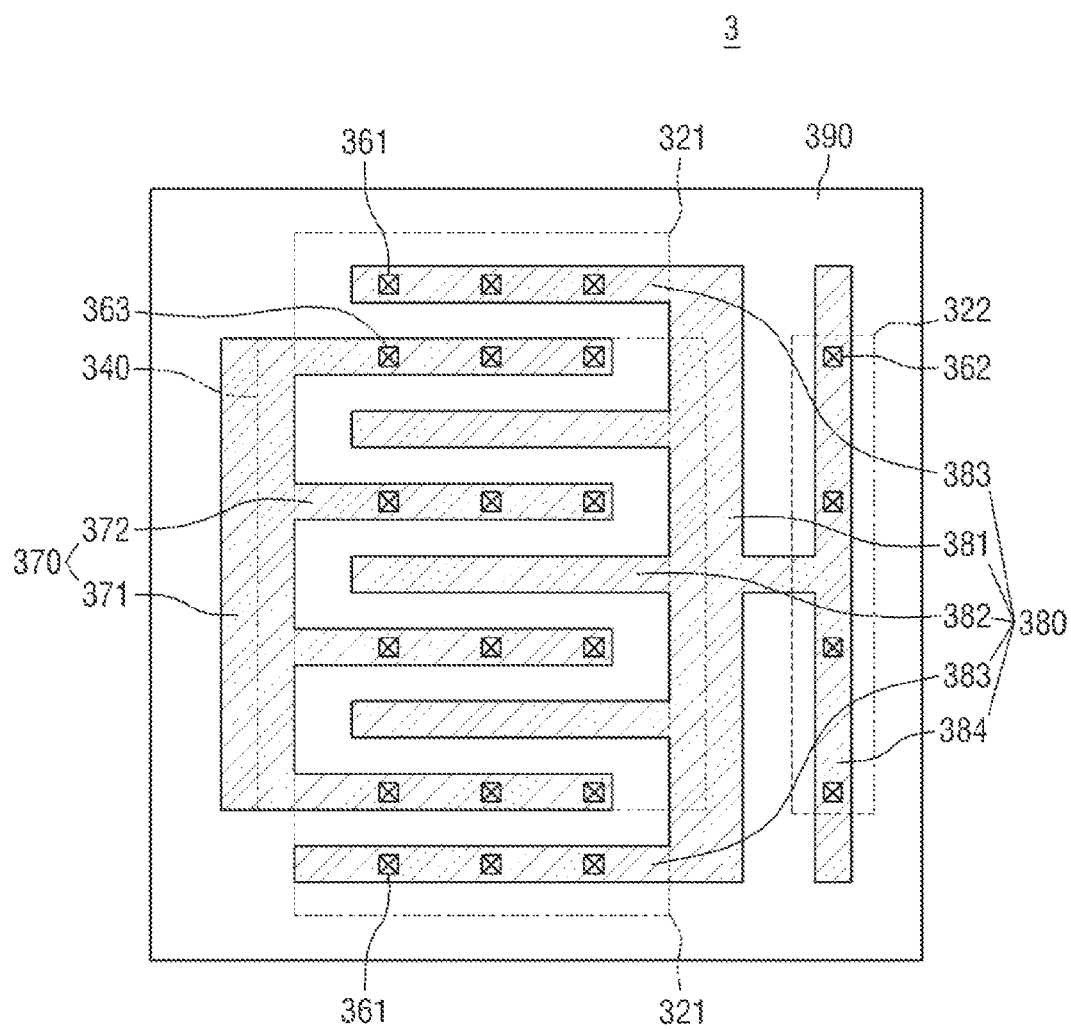
FIG. 4 is a schematic plan view explaining a capacitor structure according to a third embodiment of the present inventive concepts.

FIG. 4 is a schematic plan view explaining a capacitor structure according to a third embodiment of the present inventive concepts. For convenience in explanation, the explanation will focus on a different feature from that of FIG. 1.

Referring to FIG. 4, a capacitor structure 3 according to a third embodiment of the present inventive concepts includes a substrate, a gate insulating film, a gate pattern 340, a first impurity region 321, a second impurity region 322, a first interlayer insulating layer, first contacts 361, second contacts 362, third contacts 363, a second interlayer insulating layer 390, a first electrode 370, and a second electrode 380.

The substrate, the first interlayer insulating layer, and the second interlayer insulating layer 390 are formed substantially in the same manner as described above with reference to FIG. 1.

The gate insulating film is formed on the substrate. The gate insulating film may be formed to extend in the second direction.

The gate pattern 340 is formed on the gate insulating film.

The first impurity region 321 is formed on both sides of the gate pattern 340 in the substrate. In some embodiments, the first impurity region 321 may correspond to a source/drain region. The width of the first impurity region 321 formed on one side of the gate pattern 340 may be equal to or different from the width of the first impurity region 321 formed on the other side of the gate pattern 340, as described herein.

The second impurity region 322 is formed adjacent to the gate pattern 340 in the substrate. The second impurity region 322 may correspond to a bulk region.

The first electrode 370 is formed on the first interlayer insulating layer. The first electrode 370 may be in a finger shape. The first electrode 370 may include a first bar-shaped wiring 371 and a plurality of second finger-shaped wirings 372 connected to the first wiring 371. The first wiring 371 of the first electrode 370 may be formed to extend in the first direction, and the second wirings 372 of the first electrode 370 may be foamed to extend in the second direction. At least a part of the first wiring 371 of the first electrode 370 and the second wirings 372 may be disposed on the gate pattern 340. The second wirings 372 of the first electrode 370 may be disposed to be spaced apart from each other and to be in parallel to each other.

The second electrode 380 is formed on the first interlayer insulating layer. The second electrode 380 may be in a shape of a plurality of fingers that mesh with the plurality of fingers of the first electrode 370. The second electrode 380 may include a first bar-shaped wiring 381 and a plurality of second finger-shaped wirings 382 connected to the first wiring 381. The first wiring 381 of the second electrode 380 may be formed to extend in the first direction, and the second wirings 382 of the second electrode 380 may be formed to extend in the second direction. At least a part of the first wiring 381 of the second electrode 380 and the second wirings 382 may be disposed on the gate pattern 340. The second wirings 382 of the second electrode 380 may be disposed to be spaced apart from each other and to be parallel to each other. Further, the second electrode 380 may further include a plurality of third wirings 383 formed to extend in the second direction from both ends of the first wiring 381, or from a position proximal to both ends of the first wiring 381, and a fourth wiring 384 formed to extend in the first direction and to be connected to an intermediate portion, for example a center portion, of the first wiring 381. At least a part of the plurality of third wirings 383 may be disposed on the first impurity region 321 formed on both sides of the gate pattern 340, and at least a part of the fourth wiring 384 may be disposed on the second impurity region 322.

The first contacts 361, the second contacts 362, and the third contacts 363 are formed to penetrate the first interlayer insulating layer. The first contacts 161 connect the second electrode 380 and the first impurity region 321 to each other. Specifically, one part of the first contacts 361 may connect the third wiring 383 on one side of the second electrode 380 to the first impurity region 321 foamed on one side of the gate pattern 340, and the other part of the first contacts 361 may connect the third wiring 383 on the other side of the second electrode to the first impurity region 321 formed on the other side of the gate pattern 340. The second contacts 362 connect the second electrode 380 and the second impurity region 322 to each other. Specifically, the second contacts 362 may connect the third wiring 383 of the second electrode 380 to the second impurity region 322. The third contacts 363 may connect the first electrode 370 and the gate pattern 340 to each other. Specifically, the third contacts 363 may connect the second wirings 372 of the first electrode 370 to the gate pattern 340. The third contacts 363 may be disposed along the second direction that is an extending direction of the second wirings 372 of the first electrode 370. On the other hand, on lower portions of the second wirings 382 of the second electrode 380, the third contacts 363 are not formed, rather, the first interlayer insulating layer is disposed, and thus the second electrode 380 and the gate pattern 340 are not directly connected to each other.

According to the capacitor structure 3 according to the third embodiment of the present inventive concepts, the number of plurality of capacitors per unit area is relatively increased, and thus capacitance per unit area can be increased. Further, in the case of connecting a MOS transistor or a varactor to a VNCAP in parallel, a parameterized cell is provided by a standardized layout, and thus the model accuracy of the resulting structure can be increased.

Further, as described above with reference to FIG. 3, the first electrode 370 and the second electrode 380 may be modified to include two or more laminated wiring layers and the vias connecting the wiring layers, for example as described herein in connection with the embodiment of FIG. 2. Through this, since the surface area of the first electrode 370 and the second electrode 380 is relatively increased, the capacitance of the VNCAP is increased, and thus the capacitance of the capacitor structure 3 can be increased.

Figure 5:
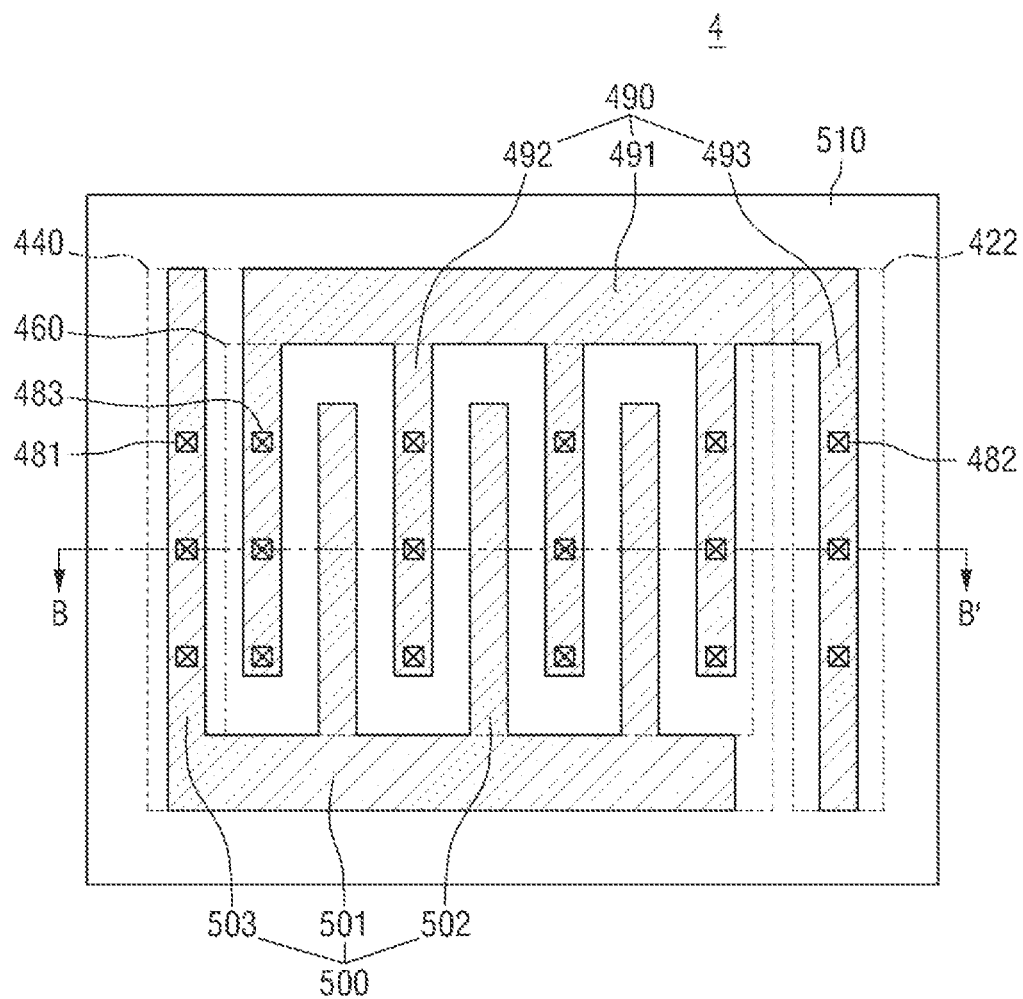
FIG. 5 is a schematic plan view explaining a capacitor structure according to a fourth embodiment of the present inventive concepts.
Figure 6:
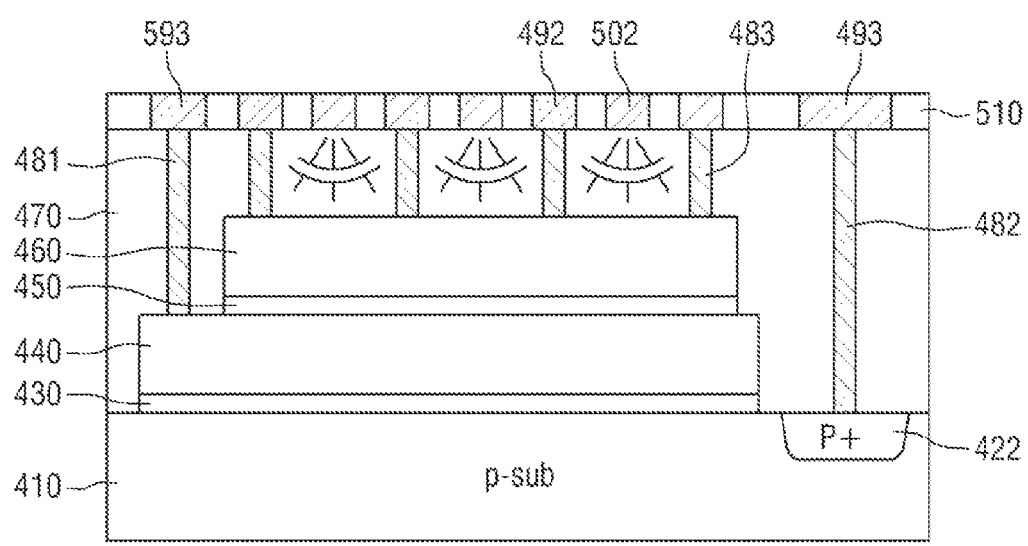
FIG. 6 is a schematic cross-sectional view cut along line B-B' in FIG. 5.

FIG. 5 is a schematic plan view explaining a capacitor structure according to a fourth embodiment of the present inventive concepts, and FIG. 6 is a schematic cross-sectional view cut along line B-B' in FIG. 5.

Referring to FIGS. 5 and 6, a capacitor structure 4 according to a fourth embodiment of the present inventive concepts includes a substrate 410, a first gate insulating film 430, a first gate pattern 440, a second gate insulating film 450, a second gate pattern 460, an impurity region 422, a first interlayer insulating layer 470, first contacts 481, second contacts 482, third contacts 483, a second interlayer insulating layer 510, a first electrode 490, and a second electrode 500.

In some embodiments, the substrate 410 may comprise a rigid substrate, such as a substrate comprising one or more semiconductor materials selected from the group including Si, Ge, SiGe, GaP, GaAs, SiC, SiGeC, InAs, and InP, an SOI substrate, a quartz substrate, and a glass substrate for display, or a flexible substrate made of polyimide, PET (PolyEthylene Terephthalate), PEN (PolyEthylene Naphthalate), PMMA (Poly Methyl MethAcrylate), PC (PolyCarbonate), PES (Polyethersulfone), or plastic material or polyester. Other semiconductor elements may be disposed on the substrate 410. Exemplarily, the semiconductor elements may include transistors, resistors, or capacitors, but are not limited thereto.

The first gate insulating film 430 is positioned on the substrate 410. The first gate insulating film 430 may be formed to extend in a second direction, for example in the direction between the right and left sides of the page of FIG. 5. In some embodiments, the first gate insulating film 430 may comprise silicon oxide or silicon nitride. In some embodiments, the first gate insulating film 430 may include SiON, but embodiments are not limited thereto. On the other hand, the first gate insulating film 430 may include one or more of hafnium oxide, hafnium silicon oxide, lanthanum oxide, lanthanum aluminum oxide, zirconium oxide, zirconium silicon oxide, tantalum oxide, titanium oxide, aluminum oxide, lead scandium tantalum oxide, and lead zinc niobate, or other suitable insulative material. In some embodiments, the first gate insulating film 430 may be a film that is obtained by laminating a plurality of films sequentially. In some embodiments, other material films may be present between the substrate 410 and the first gate insulating film 430.

The first gate pattern 440 is formed on the first gate insulating film 430. The first gate pattern 440 may be formed as a single layer or a multi-layer that includes titanium (Ti), tantalum (Ta), aluminum (Al), tungsten (W), or an alloy thereof, but is not limited thereto. The second gate insulating film 450 is formed on the first gate pattern 440. In some embodiments, the second gate insulating film 450 may be formed to extend in the second direction. The area of the second gate insulating film 450 may be smaller than the area of the first gate pattern. In some embodiments, the second gate insulating film 450 may be formed as a charge trap layer that is operable to capture charge. In some embodiments, the second gate insulating film 450 may comprise a film obtained by laminating a plurality of films in order. Exemplarily, the second gate insulating film 450 may be formed as an ONO (Oxide-Nitride-Oxide) insulating film, but is not limited thereto, as other suitable layers having charge trapping capability are equally applicable to the present inventive concepts.

The second gate pattern 460 is formed on the second gate insulating film 450. The second gate pattern 460 may be formed as a single layer or a multi-layer that includes titanium (Ti), tantalum (Ta), aluminum (Al), tungsten (W), or an alloy thereof, but is not limited thereto.

The impurity region 422 is formed adjacent to the first gate pattern 440 in the substrate 410. The impurity region 422 may correspond to a bulk region. Exemplarily, the impurity region 422 may be of a second conduction type. The second conduction type may be an n-type or a p-type. Hereinafter, explanation will be made on the assumption that the second conduction type is the p-type.

The first interlayer insulating layer 470 is formed to cover the substrate 410, the first gate insulating film 430, the first gate pattern 440, the second gate insulating film 450, and the second gate pattern 460. Exemplarily, the first interlayer insulating layer 470 may include silicon oxide, but is not limited thereto, as other insulating materials are equally applicable to the present inventive concepts. The second interlayer insulating layer 510 is formed on the first interlayer insulating layer 470. The second interlayer insulating layer 510 may include the same material as the first interlayer insulating layer 470 or a material that is different from the material of the first interlayer insulating layer 470.

The first electrode 490 is formed on the first interlayer insulating layer 470. The first electrode 490 may be in a shape of a plurality of fingers. The first electrode 490 may include a first bar-shaped wiring 491 and a plurality of second finger-shaped wirings 492 connected to the first wiring 491. The first wiring 491 of the first electrode 490 may be formed to extend in the second direction, and the second wirings 492 of the first electrode 490 may be formed to extend in the first direction, for example in the direction between the top and bottom of the page in FIG. 5. The first wiring 491 of the first electrode 490 may be disposed on a portion of the first gate pattern 440, and the second wirings 492 of the first electrode 490 may be disposed on the second gate pattern 460. The second wirings 492 of the first electrode 490 may be configured to be spaced apart from each other and to be in parallel to each other. Further, the first electrode 490 may further include a third wiring 493 formed to extend in the first direction from one end of the first wiring 491. The third wiring 493 may be disposed on the impurity region 422.

The second electrode 500 is formed on the first interlayer insulating layer 470. The second electrode 500 may be in a shape of a plurality of fingers that mesh with the fingers of the first electrode 490. The second electrode 500 may include a first bar-shaped wiring 501 and a plurality of second finger-shaped wirings 502 connected to the first wiring 501. The first wiring 501 of the second electrode 500 may be formed to extend in the second direction, and the second wirings 502 of the second electrode 500 may be formed to extend in the first direction. The first wiring 501 of the second electrode 500 may be disposed on a part of the first gate pattern 440, and the second wirings 502 of the second electrode 500 may be disposed on the second gate pattern 460. The second wirings 502 of the second electrode 500 may be disposed to be spaced apart from each other and to be in parallel to each other. Further, the second electrode 500 may further include a third wiring 503 formed to extend in the first direction from one end of the first wiring 501. The third wiring 503 may be disposed on a part of the first gate pattern 440.

The second wirings 492 of the first electrode 490 and the second wirings 502 of the second electrode 500 are alternately disposed to be spaced apart from each other. FIG. 5 illustrates that the second wiring 502 of the second electrode 500 are disposed between the second wirings 492 of the first electrode 490, but are not limited thereto. The second wirings 492 of the first electrode 490 may be disposed between the second wirings 502 of the second electrode 500. The first electrode 490 and the second electrode 500 may be insulated by the second interlayer insulating layer 510. Exemplarily, the first electrode 490 and the second electrode 500 may include metal or metal nitride, but are not limited thereto. The metal may comprise copper, tungsten, aluminum, ruthenium, platinum, titanium, or tantalum, or an alloy thereof, or another metal, and the metal nitride may comprise tungsten nitride, tantalum nitride, or titanium nitride, or other suitable material.

The first contacts 481, the second contacts 482, and the third contacts 483 are formed to penetrate the first interlayer insulating layer 470. The first contacts 481 connect the second electrode 500 and the first gate pattern 440 to each other. Specifically, the first contacts 481 may connect the third wiring 503 of the second electrode 500 to the first gate pattern 440. The second contacts 482 connect the first electrode 490 and the impurity region 422. Specifically, the second contacts 482 may connect the third wiring 493 of the first electrode 490 to the impurity region 422. The third contacts 483 connect the first electrode 490 and the second gate pattern 460 to each other. Specifically, the third contacts 483 may connect the second wirings 492 of the first electrode 490 to the second gate pattern 460. The third contacts 483 may be disposed along the first direction that is a direction of extension of the second wirings 492 of the first electrode 490. On the other hand, on lower portions of the second wirings 502 of the second electrode 500, the third contacts 483 are not formed, but instead the first interlayer insulating layer 470 is disposed, and thus the second electrode 500 and the second gate pattern 460 are not connected to each other. Exemplarily, the first contacts 481, the second contacts 482, and the third contacts 483 may include metal or metal nitride, but are not limited thereto.

A first voltage may be applied to the first electrode 490, and a second voltage may be applied to the second electrode 500. According to the capacitor structure 4 of the fourth embodiment of the present inventive concepts, the substrate 410, the first gate insulating film 430, and the first gate pattern 440 form a first capacitor. Further, the first gate pattern 440, the second gate insulating film 450, and the second gate pattern 460 form second capacitors. Exemplarily, the first capacitor and the second capacitor may be flash cell capacitors. Further, the second wirings 492 of the first electrode 490, the second interlayer insulating layer 510, and the second wirings 502 of the second electrode 500 form a third capacitor. The third capacitor may be a vertical natural capacitor (VNCAP). Further, the second wirings 502 of the second electrode 500, the first interlayer insulating layer 470, and the second gate pattern 460 form fourth capacitors. Thus, according to the capacitor structure 4 according to the fourth embodiment of the present inventive concepts, a plurality of capacitors per unit area can be formed, and thus capacitance per unit area can be increased. Further, in the case of connecting a flash cell capacitor to a VNCAP in parallel, a parameterized cell is provided by a standardized layout, and thus the model accuracy of the resulting overall capacitor can be increased.

Figure 7:
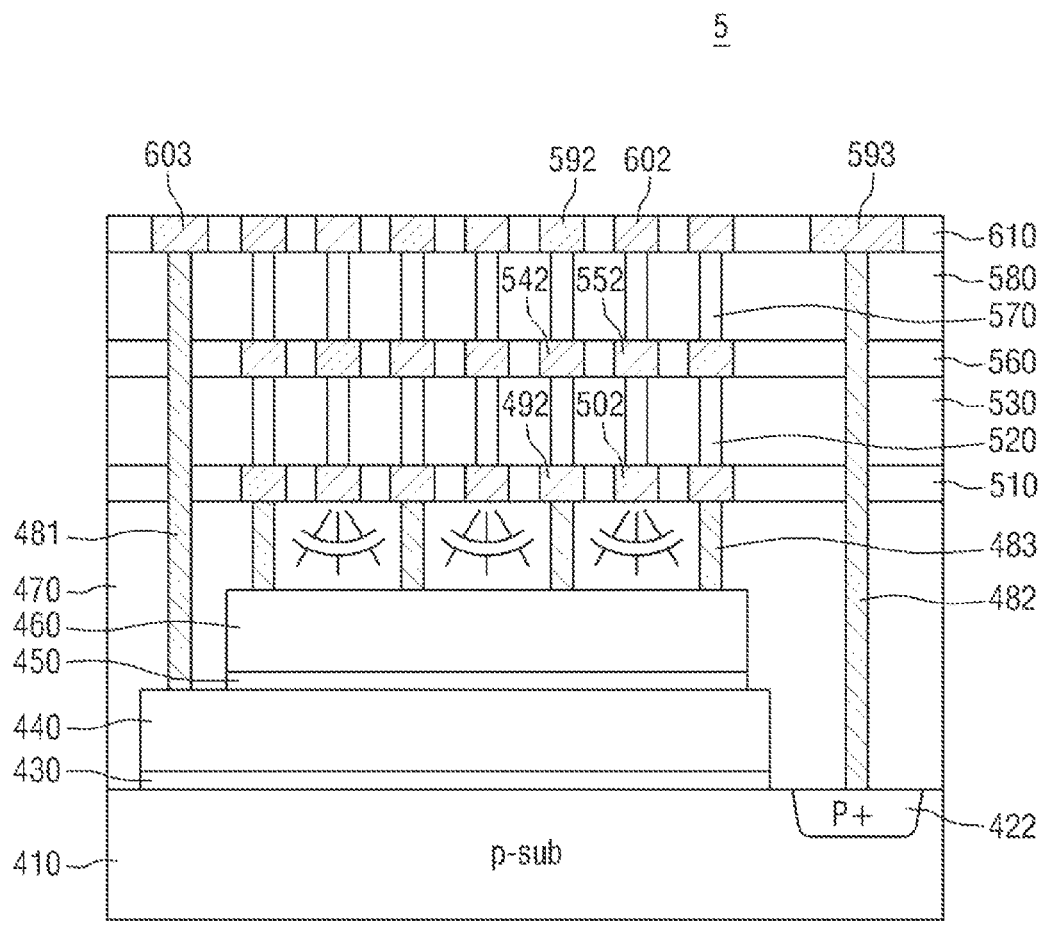
FIG. 7 is a schematic cross-sectional view cut along the same line as line B-B' in FIG. 5, explaining a capacitor structure according to a fifth embodiment of the present inventive concepts.

FIG. 7 is a schematic cross-sectional view cut along the same line as the line B-B' in FIG. 5, explaining a capacitor structure according to a fifth embodiment of the present inventive concepts. For convenience in explanation, the explanation will focus on a different feature from that of FIG. 6.

Referring to FIG. 7, a capacitor structure 5 according to a fifth embodiment of the present inventive concepts includes a substrate 410, a first gate insulating film 430, a first gate pattern 440, a second gate insulating film 450, a second gate pattern 460, an impurity region 422, a first interlayer insulating layer 470, first contacts 481, second contacts 482, third contacts 483, a second interlayer insulating layer 510, a first electrode, and a second electrode.

The substrate 410, the first gate insulating film 430, the first gate pattern 440, the second gate insulating film 450, the second gate pattern 460, the impurity region 422, the first interlayer insulating layer 470, the first contacts 481, the second contacts 482, the third contacts 483, and the second interlayer insulating layer 510 are formed substantially in the same manner as described above with reference to FIGS. 5 and 6.

Each of the first electrode and the second electrode includes two or more laminated wiring layers and vias connecting the wiring layers.

Exemplarily, the first electrode may include a first wiring layer, a third wiring layer, and a fifth wiring layer, and the second electrode may include a second wiring layer, a fourth wiring layer, and a sixth wiring layer. The first wiring layer and the second wiring layer may be formed on the first interlayer insulating layer 470, the third wiring layer and the fourth wiring layer may be formed on a third interlayer insulating layer 530, and the fifth wiring layer and the sixth wiring layer may be formed on a fifth interlayer insulating layer 580. First vias 520 are formed to penetrate the third interlayer insulating layer 530, and second vias 570 are formed to penetrate the fifth interlayer insulating layer 580. The first wiring layer and the third wiring layer, and the second wiring layer and the fourth wiring layer are respectively connected through the first vias 520. The third wiring layer and the fifth wiring layer, and the fourth wiring layer and the sixth wiring layer are respectively connected through the second vias 570. Exemplarily, the first vias 520 and the second vias 570 may include polysilicon, but are not limited thereto. The respective wiring layers, substantially in the same manner as described above, may include a first bar-shaped wiring and a plurality of second finger-shaped wirings 492, 502, 542, 552, 592, and 602 connected to the first wiring.

On the second interlayer insulating layer 510, the third interlayer insulating layer 530, a fourth interlayer insulating layer 560, the fifth interlayer insulating layer 580, and a sixth interlayer insulating layer 610 are laminated in order. The interlayer insulating layers 510, 530, 560, 580, and 610 may include the same material as the first interlayer insulating layer 470 or a material that is different from the material of the first interlayer insulating layer 470. The first electrode and the second electrode may be insulated from each other by the second interlayer insulating layer 510, the fourth interlayer insulating layer 560, and the sixth interlayer insulating layer 610.

FIG. 7 illustrates that the third wiring 593 of the first electrode is formed to extend from the first wiring of the fifth wiring layer, but embodiments of the present inventive concepts are not limited thereto. The third wiring 593 of the first electrode may be formed to extend from the first wiring of any one wiring layer among the two or more laminated wiring layers of the first electrode. Further, it is illustrated that the third wiring 603 of the second electrode is formed to extend from the first wiring of the sixth wiring layer, but embodiments are not limited thereto. The third wiring 603 of the second electrode may be formed to extend from the first wiring of any one wiring layer among the two or more laminated wiring layers of the second electrode.

According to the capacitor structure 5 according to the fifth embodiment of the present inventive concepts, since the number of capacitors per unit area of the first electrode and the second electrode is relatively increased, the capacitance of the resulting VNCAP is increased, and thus the capacitance of the capacitor structure 5 can be increased.

Figure 8:
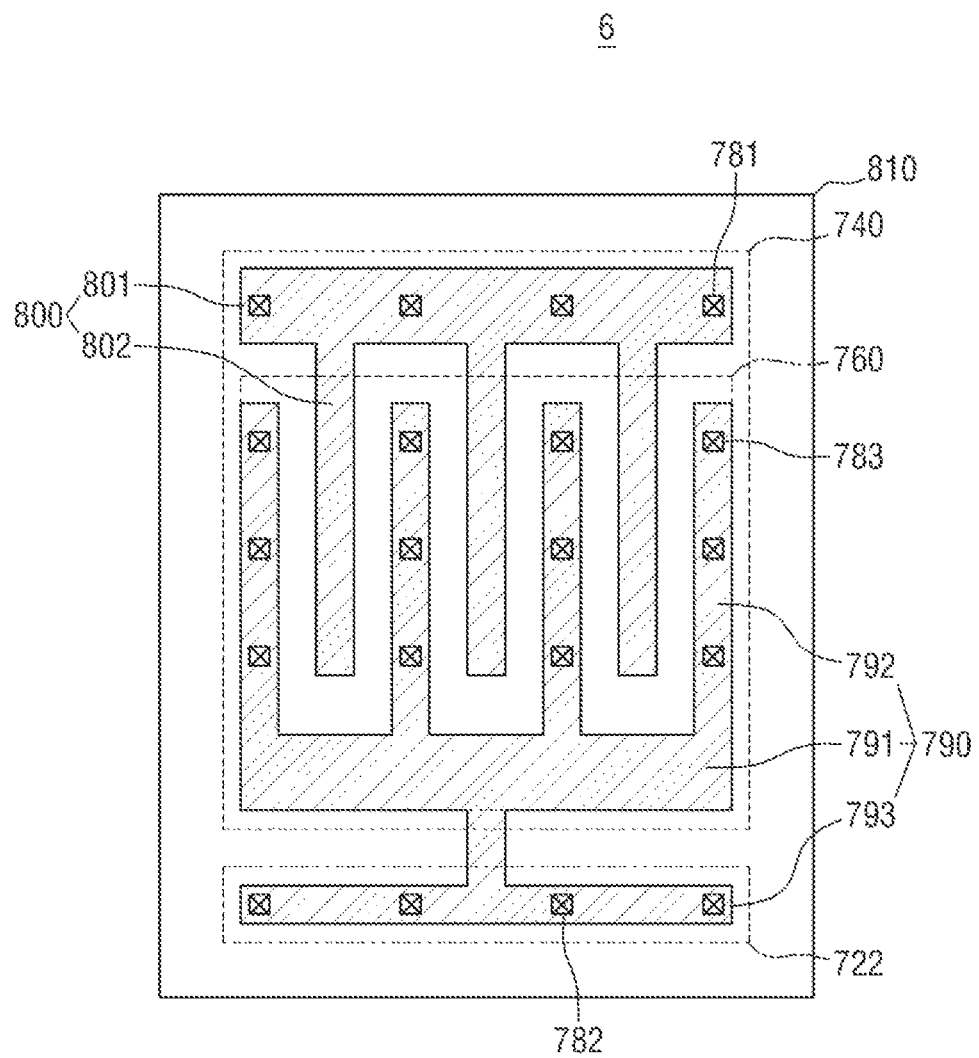
FIG. 8 is a schematic plan view explaining a capacitor structure according to a sixth embodiment of the present inventive concepts.

FIG. 8 is a schematic plan view explaining a capacitor structure according to a sixth embodiment of the present inventive concepts. For convenience in explanation, the explanation will focus on a different feature from that of FIG. 5.

Referring to FIG. 5, a capacitor structure 6 according to a sixth embodiment of the present inventive concepts includes a substrate, a first gate insulating film, a first gate pattern 740, a second gate insulating film, a second gate pattern 760, an impurity region 722, a first interlayer insulating layer, first contacts 781, second contacts 782, third contacts 783, a second interlayer insulating layer 810, a first electrode 790, and a second electrode 800.

The substrate, the first interlayer insulating layer, and the second interlayer insulating layer 810 are formed substantially in the same manner as described above with reference to FIG. 5.

The first gate insulating film is formed on the substrate. The first gate insulating film may be formed to extend in the first direction.

The first gate pattern 740 is formed on the gate insulating film.

The second gate insulating film is formed on the first gate pattern 740. The second gate insulating film may be formed to extend in the first direction. The area of the second gate insulating film may be smaller than the area of the first gate pattern 740.

The second gate pattern 760 is formed on the second gate insulating film.

The impurity region 722 is positioned adjacent to the first gate pattern 740 in the substrate. The impurity region 722 may correspond to a bulk region.

The first electrode 790 is formed on the first interlayer insulating layer. The first electrode 790 may be in a shape of a plurality of fingers. The first electrode 790 may include a first bar-shaped wiring 791 and a plurality of second finger-shaped wirings 792 connected to the first wiring 791. The first wiring 791 of the first electrode 790 may be formed to extend in the second direction, and the second wirings 792 of the first electrode 790 may be formed to extend in the first direction. The first wiring 791 and the second wirings 792 of the first electrode 790 may be disposed on the second gate pattern 760. The second wirings 792 of the first electrode 790 may be disposed to be spaced apart from each other and to be in parallel to each other. Further, the first electrode 790 may further include a third wiring 793 which is formed to extend in the second direction and is connected to a center portion of the first wiring 791. The third wiring 793 may be disposed on the impurity region 722.

The second electrode 800 is formed on the first interlayer insulating layer. The second electrode 800 may be in a shape of a plurality of fingers that mesh with the fingers of the first electrode 790. The second electrode 800 may include a first bar-shaped wiring 801 and a plurality of second finger-shaped wirings 802 connected to the first wiring 801. The first wiring 801 of the second electrode 800 may be formed to extend in the second direction, and the second wirings 802 of the second electrode 800 may be formed to extend in the first direction. The first wiring 801 of the second electrode 800 may be disposed on a part of the first gate pattern 740, and the second wirings 802 of the second electrode 800 may be disposed on the second gate pattern 760. The second wirings 802 of the second electrode 800 may be positioned to be spaced apart from each other and to be in parallel to each other.

The first contacts 781, the second contacts 782, and the third contacts 783 are formed to penetrate the first interlayer insulating layer. The first contacts 781 connect the second electrode 800 and the first gate pattern 740 to each other. Specifically, the first contacts 781 may connect the first wiring 801 of the second electrode 800 to the first gate pattern 740. The second contacts 782 connect the first electrode 790 and the impurity region 722. Specifically, the second contacts 782 may connect the third wiring 793 of the first electrode 790 to the impurity region 722. The third contacts 783 connect the first electrode 790 and the second gate pattern 760 to each other. Specifically, the third contacts 783 may be disposed along the first direction that is an extending direction of the second wirings 792 of the first electrode 790. On the other hand, on the lower portion of the second wirings 802 of the second electrode 800, the third contacts 783 are not formed; instead the first interlayer insulating layer is disposed, and thus the second electrode 800 and the second gate pattern 760 are not connected to each other.

According to the capacitor structure 6 according to the sixth embodiment of the present inventive concepts, as described above, a plurality of capacitors per unit area can be formed, and thus capacitance per unit area can be relatively increased. Further, in the case of connecting a flash cell capacitor to a VNCAP in parallel, a parameterized cell is provided by a standardized layout, and thus the model accuracy can be increased.

Further, as described above with reference to FIG. 7, the first electrode 790 and the second electrode 800 may be modified to include the two or more laminated wiring layers and the vias connecting the wiring layers. Through this, since the surface area of the first electrode 790 and the second electrode 800 is increased, the capacitance of the VNCAP is increased, and thus the capacitance of the capacitor structure 6 can be increased.

In the present description, while the fingers of the various electrodes are shown as being linear or straight in extension, other finger geometries are equally applicable to the embodiments of the present inventive concepts. For example, fingers that change direction between the first and second directions, fingers in a zig-zag shape, and fingers in a sinuous shape, can be employed. Irrespective of shape, the fingers of the first and second electrodes should be spaced apart and positioned generally parallel to each other, so as to interleave with each other in a spaced-apart configuration in which they are insulated from each other. In this sense, the fingers of the first and second electrodes can be considered to "mesh" with each other.

Hereinafter, a method for fabricating a capacitor structure according to an embodiment of the present inventive concepts will be described.

FIGS. 9 to 14 are schematic cross-sectional views of intermediate steps explaining a method for fabricating a capacitor structure according to the second embodiment of the present inventive concepts.

Figure 9:
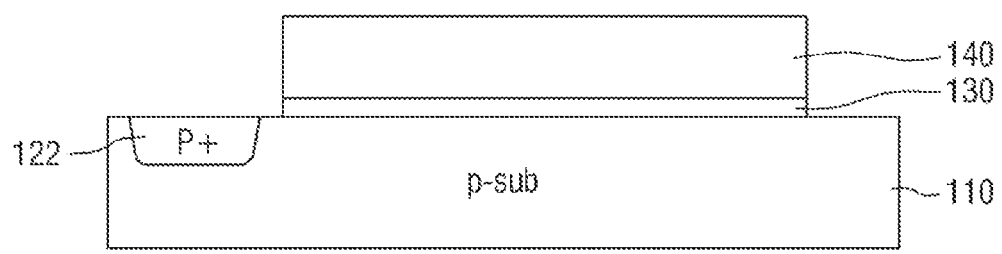
FIGS. 9 to 14 are schematic cross-sectional views of intermediate steps explaining a method for fabricating a capacitor structure according to the second embodiment of the present inventive concepts.

Referring to FIG. 9, a substrate 110 is first prepared, and a gate insulating film 130 and a gate pattern 140 are formed on the substrate 110. In order to form the gate insulating film 130 and the gate pattern 140, MOCVD (Metal Organic Chemical Vapor Deposition), CVD (Chemical Vapor Deposition), PLD (Physical Vapor Deposition), or ALD (Automatic Layer Deposition) may be used, but embodiments are not limited thereto. Then, by performing an ion injection process, a first impurity region 121 and a second impurity region 122 are formed in the substrate 110.

Figure 10:
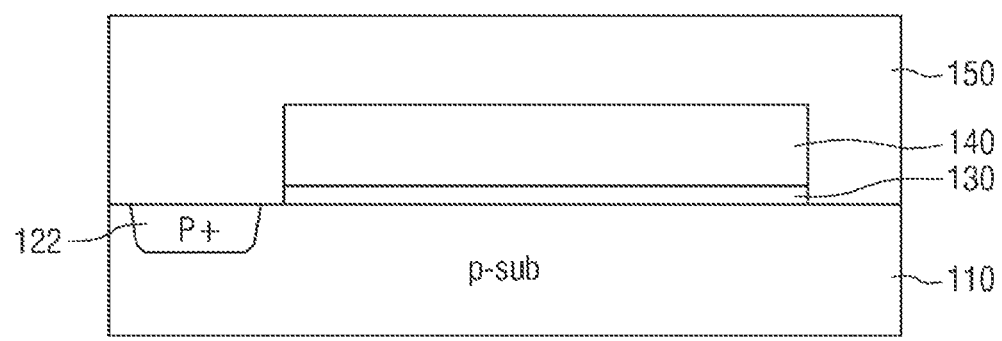

Referring to FIG. 10, a first interlayer insulating film 150 that covers the substrate 110, the first gate insulating film 130, and the gate pattern 140 is formed.

Figure 11:
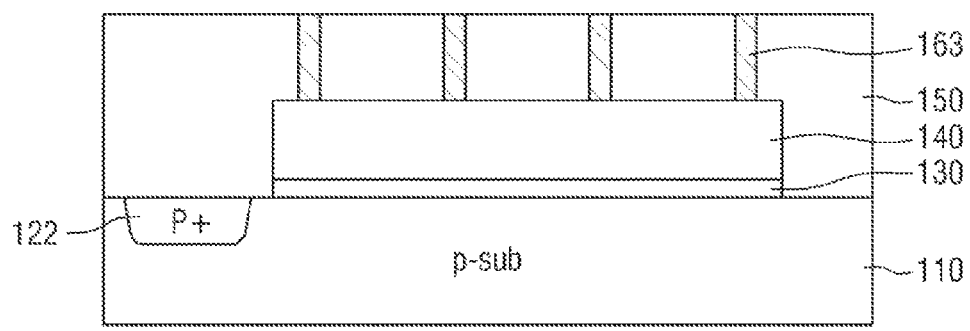

Referring to FIG. 11, by partially etching the first interlayer insulating layer 150, a plurality of contact holes for partially exposing the gate pattern 140 are formed. A conductive film that fills the plurality of contact holes is formed on the first interlayer insulating layer 150, and third contacts 163 are formed by performing a planarization process until the first interlayer insulating layer 150 is exposed. Exemplarily, the planarization process may be a chemical mechanical planarization (CMP) process, but embodiments are not limited thereto.

Figure 12:
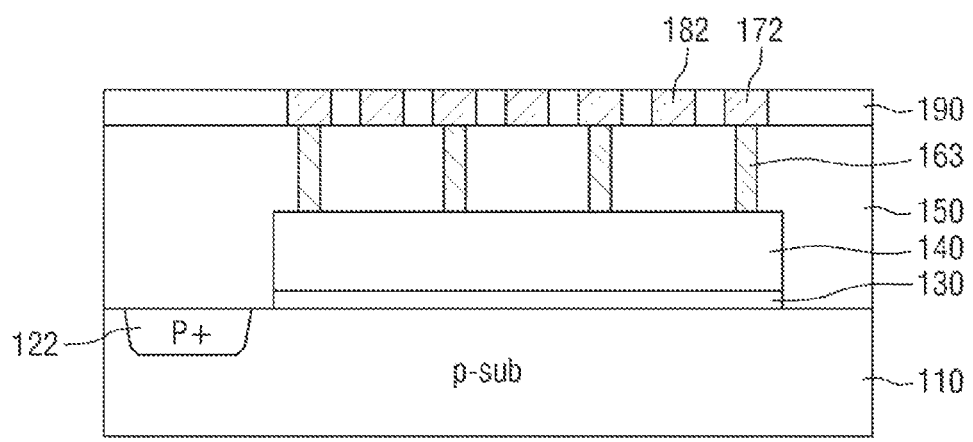

Referring to FIG. 12, a second interlayer insulating layer 190 is formed on the first interlayer insulating layer 150. Openings in which a first electrode and a second electrode are disposed are formed by patterning the second interlayer insulating layer 190. A conductive film that fills the openings is formed on the second interlayer insulating layer 190, and a first wiring layer of the first electrode and a second wiring layer of the second electrode are formed by performing a planarization process until the second interlayer insulating layer 190 is exposed.

Figure 13:
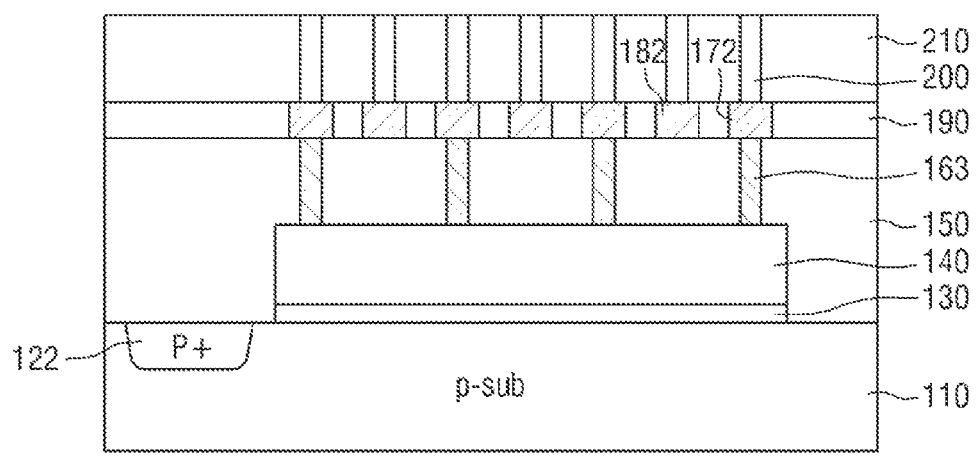

Referring to FIG. 13, a third interlayer insulating layer 210 is formed on the second interlayer insulating layer 190. By partially etching the third interlayer insulating layer 210, a plurality of via holes for partially exposing the first electrode and the second electrode are formed. A silicon film that fills the plurality of via holes is formed on the third interlayer insulating layer 210, and first vias are formed by performing a planarization process until the third interlayer insulating layer 210 is exposed.

Figure 14:
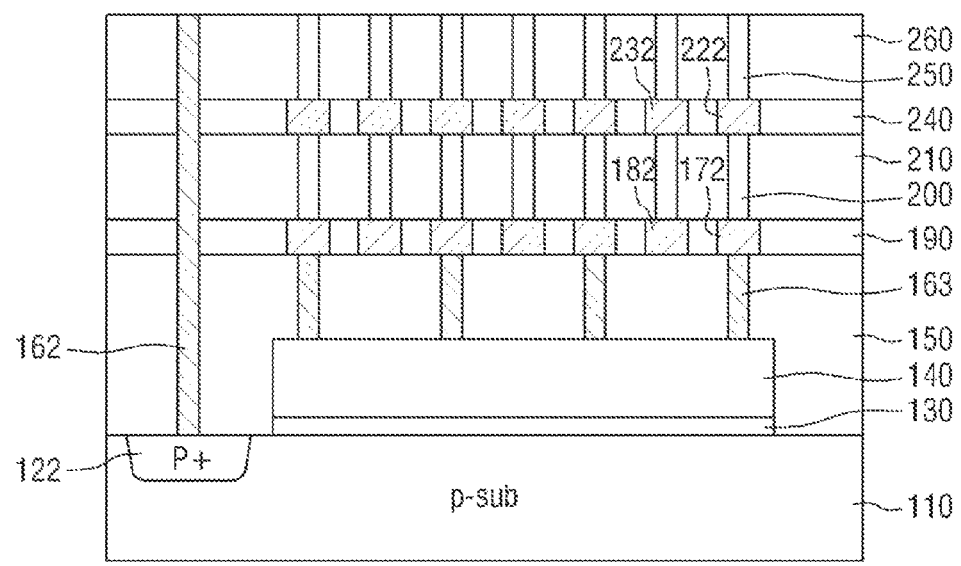

Referring to FIG. 14, in substantially the same method as described above with reference to FIGS. 12 and 13, a third wiring layer of the first electrode and a fourth wiring layer of the second electrode are formed, and second vias 250 are formed. By partially etching the interlayer insulating layers 150, 190, 210, 240, and 260, a plurality of contact holes for partially exposing impurity regions 121 and 122 are formed. A conductive film that fills the plurality of contact holes is formed on the fifth interlayer insulating layer 260, and first contacts 161 and second contacts 162 are formed by performing a planarization process until the fifth interlayer insulating layer 260 is exposed.

Referring again to FIG. 3, in substantially the same method as described above with reference to FIG. 12, a fifth wiring layer of the first electrode and a sixth wiring layer of the second electrode are formed. A third wiring 283 and a fourth wiring of the second electrode are formed to extend from the first wiring of the sixth wiring layer to complete the capacitor structure 2.

FIGS. 15 to 18 are schematic cross-sectional views of intermediate steps explaining a method for fabricating a capacitor structure according to the fifth embodiment of the present inventive concepts.

Figure 15:
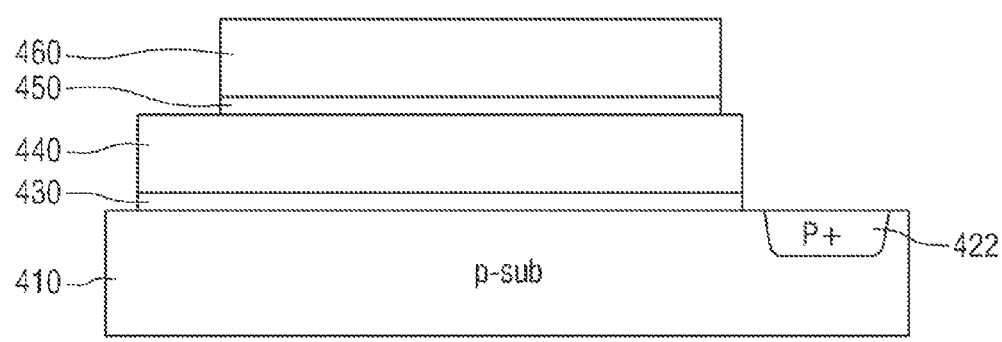
FIGS. 15 to 18 are schematic cross-sectional views of intermediate steps explaining a method for fabricating a capacitor structure according to the fifth embodiment of the present inventive concepts.

Referring to FIG. 15, a substrate 410 is first prepared, and a first gate insulating film 430, a first gate pattern 440, a second gate insulating film 450, and a second gate pattern 460 are formed on the substrate 410. In order to form the gate insulating films 430 and 450 and the gate patterns 440 and 460, MOCVD (Metal Organic Chemical Vapor Deposition), CVD (Chemical Vapor Deposition), PLD (Physical Vapor Deposition), or ALD (Automatic Layer Deposition) may be used, but is not limited thereto. Then, by performing an ion injection process, an impurity region 422 is formed in the substrate 110.

Figure 16:
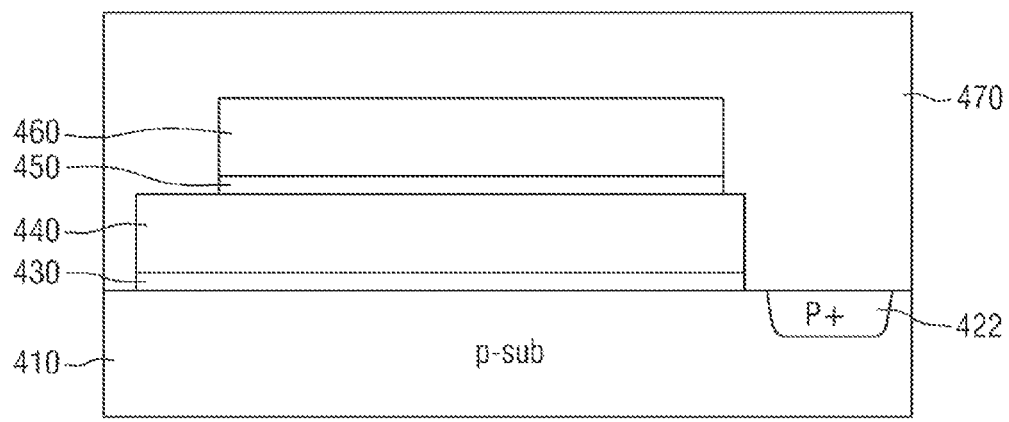

Referring to FIG. 16, a first interlayer insulating film 470 that covers the substrate 410, the first gate insulating film 430, the first gate pattern 440, the second gate insulating film 450, and the second gate pattern 460 is formed.

Figure 17:
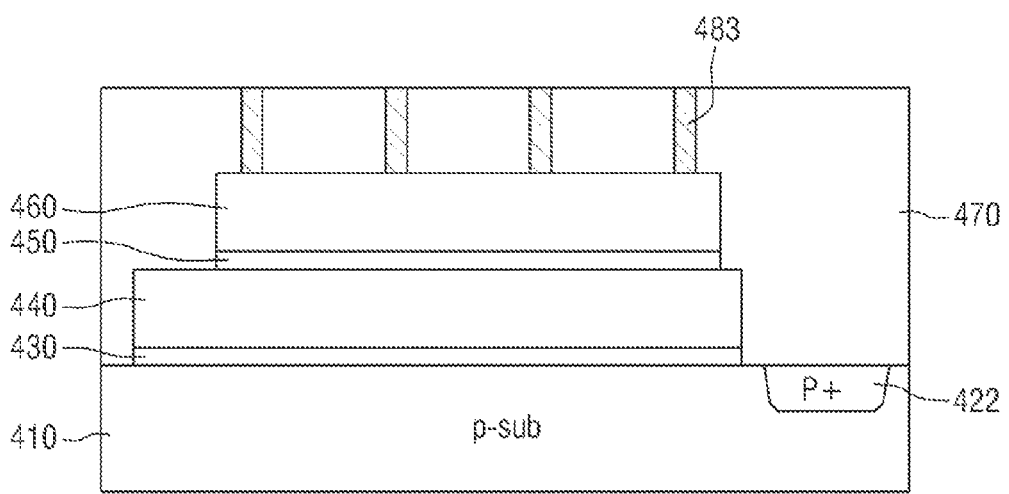

Referring to FIG. 17, by partially etching the first interlayer insulating layer 470, a plurality of contact holes for partially exposing the second gate pattern 460 are formed. A conductive film that fills the plurality of contact holes is formed on the first interlayer insulating layer 470, and third contacts 483 are formed by performing a planarization process until the first interlayer insulating layer 470 is exposed. Exemplarily, the planarization process may comprise a chemical mechanical planarization (CMP) process, but embodiments are not limited thereto.

Figure 18:
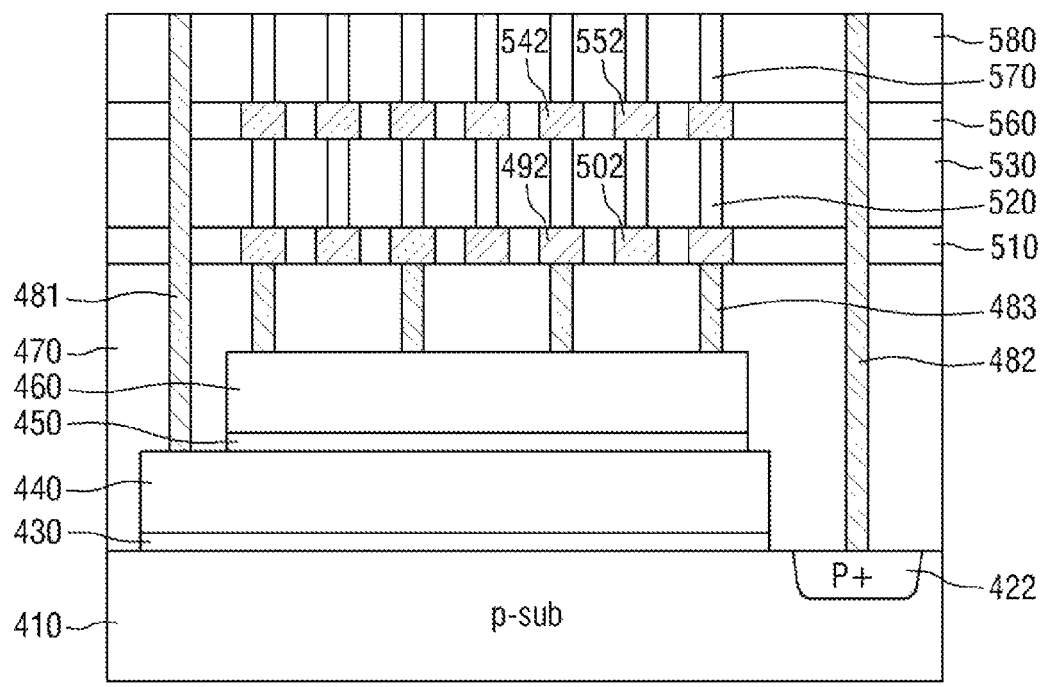

Referring to FIG. 18, in substantially the same method as described above with reference to FIGS. 12 and 13, a first wiring layer and a third wiring layer of the first electrode and a second wiring layer and a fourth wiring layer of the second electrode are formed, and first vias 520 and second vias 570 are formed. By partially etching the interlayer insulating layers 470, 510, 530, 560, and 580, a plurality of contact holes for partially exposing the first gate pattern 440 and a plurality of contact holes for partially exposing the impurity region 422 are foamed. Then, a conductive film that fills the plurality of contact holes is formed on the fifth interlayer insulating layer 580, and first contacts 481 and second contacts 482 are formed by performing a planarization process until the fifth interlayer insulating layer 580 is exposed.

Referring again to FIG. 7, in substantially the same method as described above with reference to FIG. 12, a fifth wiring layer of the first electrode and a sixth wiring layer of the second electrode are formed. Then, a third wiring 593 of the first electrode is formed to extend from the first wiring of the fifth wiring layer, and a third wiring 603 of the second electrode is formed to extend from the first wiring of the sixth wiring layer to complete the capacitor structure 5.

Since a method for fabricating a capacitor structure 1, 3, 4, or 6 according to another embodiment of the present inventive concepts is apparent to those of ordinary skill in the art to which the present inventive concepts pertains from the method for fabricating the capacitor structure as described above with reference to FIGS. 9 to 18, the detailed description thereof will be omitted.

In concluding the detailed description, those skilled in the art will appreciate that many variations and modifications can be made to the embodiments without substantially departing from the principles of the present inventive concepts. Therefore, the disclosed embodiments of the inventive concepts are used in a generic and descriptive sense only and not for purpose of limitation.

What is claimed is:

1. A capacitor structure comprising:
a substrate extending in a horizontal direction of extension;
a first gate insulating film on the substrate;
a first gate pattern on the first gate insulating film;
a first finger-shaped electrode on the first gate pattern; and
a second finger-shaped electrode on the first gate pattern and alternately disposed with the first electrode to be spaced apart from the first electrode in the horizontal direction,
wherein the first electrode is connected to the first gate pattern, and wherein the second electrode and the first gate pattern are insulated from each other.

2. The capacitor structure of claim 1, wherein the first electrode and the second electrode further comprise two or more laminated wiring layers and vias connecting the wiring layers.

3. The capacitor structure of claim 1, further comprising a first impurity region of a first conduction type that is at sides of the first gate pattern in the substrate,
wherein the second electrode is connected to the first impurity region.

4. The capacitor structure of claim 1, further comprising a first conduction type well in the substrate and a first impurity region of a first conduction type at sides of the first gate pattern in the well,
wherein the second electrode is connected to the first impurity region.

5. The capacitor structure of claim 1, wherein the first gate insulating film comprises at least one SiON, tantalum oxide, titanium oxide, hafnium oxide, lanthanum oxide, and aluminum oxide.

6. The capacitor structure of claim 1, further comprising a second gate insulating film on the substrate and a second gate pattern between the second gate insulating film and the first gate insulating film.

7. The capacitor structure of claim 6, wherein the second electrode is connected to the second gate pattern.

8. The capacitor structure of claim 6, wherein the first gate insulating film comprises an ONO (Oxide-Nitride-Oxide) insulating film, and the second gate insulating film comprises at least one of SiON, tantalum oxide, titanium oxide, hafnium oxide, lanthanum oxide, and aluminum oxide.

9. The capacitor structure of claim 1, wherein a first voltage is applied to the first electrode, and a second voltage is applied to the second electrode.

10. A capacitor structure comprising:
a substrate extending in a horizontal direction of extension;
a first gate insulating film on the substrate;
a first gate pattern on the first gate insulating film;
an interlayer insulating layer covering the substrate, the first gate insulating film, and the first gate pattern;
a first finger-shaped electrode on the interlayer insulating layer;
a second finger-shaped electrode on the interlayer insulating layer and alternately disposed with the first electrode to be spaced apart from the first electrode in the horizontal direction; and
first contacts through the interlayer insulating film and connecting the first electrode and the first gate pattern to each other.

11. The capacitor structure of claim 10, wherein the first electrode and the second electrode further comprise two or more laminated wiring layers and vias connecting the wiring layers.

12. The capacitor structure of claim 10, further comprising a first impurity region of a first conduction type that is at sides of the first gate pattern in the substrate,
wherein the second electrode is connected to the first impurity region.

13. The capacitor structure of claim 10, further comprising a first conduction type well in the substrate and a first impurity region of a first conduction type at sides of the first gate pattern in the well,
wherein the second electrode is connected to the first impurity region.

14. The capacitor structure of claim 10, further comprising a second gate insulating film on the substrate and a second gate pattern between the second gate insulating film and the first gate insulating film,
wherein the interlayer insulating layer covers the substrate, the first gate insulating film, the first gate pattern, the second gate insulating film, and the second gate pattern.

15. The capacitor structure of claim 14, further comprising second contacts through the interlayer insulating film and connecting the second electrode and the second gate pattern to each other.

16. A capacitor structure comprising:
a first capacitor comprising a first electrode, a dielectric, and a second electrode, the first electrode being a substrate, the second electrode on the dielectric and the dielectric on the substrate; and
a second capacitor on the first capacitor, the second capacitor comprising a vertical natural capacitor,
wherein the second capacitor comprises a first electrode comprising a plurality of first fingers on the second electrode of the first capacitor and a second electrode comprising a plurality of second fingers on the second electrode of the first capacitor, the second fingers alternately disposed with the first fingers to be spaced apart from the first fingers in a horizontal direction of extension of the substrate, and
wherein the first fingers are connected to the second electrode of the first capacitor and one of the second fingers is connected to an impurity region in the substrate.

17. The capacitor structure of claim 16:
wherein the second capacitor comprises the first fingers and second fingers meshing with each other, the first and second fingers positioned at a patterned conductive layer that is on the first capacitor, an insulating layer between at least portions of the first and second fingers and the second electrode of the first capacitor.

18. The capacitor structure of claim 17, further comprising first vias connecting one of the first fingers and second fingers to the second electrode of the first capacitor and wherein a third capacitor is present between the other of the first fingers and second fingers and the second electrode of the first capacitor.

19. The capacitor structure of claim 16, further comprising a fourth capacitor on the first capacitor, wherein the fourth capacitor comprises:
a first electrode of the fourth capacitor that is the second electrode of the first capacitor; and
a dielectric of the fourth capacitor on the first electrode of the fourth capacitor, and a second electrode of the fourth capacitor on the dielectric of the fourth capacitor.

20. The capacitor structure of claim 16 wherein the vertical natural capacitor comprises a plurality of patterned conductive layers, the conductive layers separated from neighboring conductive layers by insulating layers, each conductive layer comprising a first electrode comprising a plurality of first fingers and a second electrode comprising a plurality of second fingers, the first fingers and second fingers separated from each other in a horizontal direction of extension of the substrate and the first fingers and second fingers meshing with each other, the first fingers of different ones of the conductive layers connected to each other by conductive vias and the second fingers of different ones of the conductive layers connected to each other by conductive vias.

\* \* \* \* \*